United States Patent
Chao et al.

(10) Patent No.: US 8,228,727 B2
(45) Date of Patent: Jul. 24, 2012

(54) METHOD FOR PROGRAMMING MULTI-LEVEL CELL AND MEMORY APPARATUS

(75) Inventors: Yuan-Peng Chao, Hsinchu (TW); Yao-Wen Chang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 372 days.

(21) Appl. No.: 12/623,110

(22) Filed: Nov. 20, 2009

(65) Prior Publication Data

US 2011/0122690 A1  May 26, 2011

(51) Int. Cl.
*G11C 16/04* (2006.01)

(52) U.S. Cl. .......... 365/185.03; 365/185.18; 365/185.24

(58) Field of Classification Search ............. 365/185.03, 365/185.18, 185.24, 185.22
See application file for complete search history.

(56) References Cited

U.S. PATENT DOCUMENTS 7,251,158 B2 *  7/2007  Hsia et al. ............... 365/185.03
7,692,962 B2 *  4/2010  Hamilton et al. ........ 365/185.03
* cited by examiner

*Primary Examiner* — David Lam
(74) *Attorney, Agent, or Firm* — J.C. Patents

(57) ABSTRACT

A method for programming a multi-level cell and a memory apparatus are described, wherein each cell has two storage sites. The method includes making the first storage site have a first Vt level and the second storage site have a second Vt level. The first Vt level is selected from M Vt levels. When the first Vt level is the i-th level among the M Vt levels, the second Vt level is selected from $n_i$ Vt levels, wherein at least one $n_i$ is not equal to $n_{i-1}$ ($2 \leq i \leq M$). The multi-level cell has P storage states, wherein $$P = \sum_{i=1}^{M} n_i.$$

The memory apparatus includes multiple multi-level cells and an operation circuit capable of performing the above method.

14 Claims, 2 Drawing Sheets

METHOD FOR PROGRAMMING MULTI-LEVEL CELL AND MEMORY APPARATUS

BACKGROUND OF THE INVENTION

1. Field of the Invention

The invention relates to operation of semiconductor device and a semiconductor apparatus, and more particularly to a method for programming a multi-level cell and a memory apparatus using the programming method.

2. Description of Related Art

With the rising demand for memory capacity of electronic products, the memory in which each cell has two storage sites and is thus capable of storing two or more bits has gradually become the mainstream, but such memory suffers from interference between the two storage sites in operation, which is commonly called the $2^{nd}$-bit effect.

FIG. 1 illustrates a conventional non-volatile cell having two storage sites and possible threshold voltages (Vt) distributions of each storage site. The cell 10 includes a substrate 100, a gate 110, a charge trapping layer 120 between the substrate 100 and the gate 110, two doping regions 130 in the substrate 100 beside the gate 110. The first/second storage site 122/124 is located in the charge trapping layer 120 near the first/second doping region 130.

Such memory cell usually adopts reverse read. Taking the first storage site 122 as an example, during its reading a depletion region 140 is formed below the second storage site 124 to prevent influence by the charges in the same. However, when there are numerous charges in the second storage site 124 with a distribution range exceeding the border of the depletion region 140, the reading of the first storage site 122 is affected, which is one of the causes of the $2^{nd}$-bit effect.

Referring again to FIG. 1, in a multi-level operation mode, when each of the first storage site 122 and the second storage site 124 has a variation of 4 Vt levels, each cell can store 4 bits ($4 \times 4 = 16 = 2^4$). The lowest first level corresponds to the state of not storing any charge, whose Vt distribution is wider due to the influence of the fabrication process while the central value of the Vt distribution increases with the ascending storage amount of charges in the other storage site (i.e., the rise in the Vt level). That is, the central values of the distributions D1, D2, D3 and D4 of the $1^{st}$ Vt level of the second storage site 124 (or the first storage site 122) when the first storage site 122 (or the second storage site 124) is at the $1^{st}$, $2^{nd}$, $3^{rd}$ and $4^{th}$ levels respectively are in the order of D4>D3>D2>D1. As for the $2^{nd}$ to $4^{th}$ levels corresponding to the states of storing charges, their Vt distributions are narrower because of the advancement in the programming technology and are not influenced by the $2^{nd}$-bit effect.

Since the Vt distribution width of the $1^{st}$ level varies with the $2^{nd}$-bit effect, a Vt margin has to be reserved when setting the $2^{nd}$ level to prevent mis-reading resulting from an overly small reading window between the first and second levels. However, the Vt margin can not be set as overly large. Therefore, the reading window between the first and second levels is still insufficient, which is adverse to the miniaturization of the memory cell.

SUMMARY OF THE INVENTION

The invention provides a method for programming a multi-level cell, which is capable of solving the problems of the related art.

The invention also provides a memory apparatus using the programming method of the invention.

The method for programming a multi-level cell of the invention is applied to a multi-level cell having first and second storage sites, which makes the first storage site have a first Vt level and the second storage site have a second Vt level. The first Vt level is selected from M Vt levels. When the first Vt level is an i-th level among the M Vt levels, the second Vt level is selected from $n_i$ Vt levels, wherein at least one $n_i$ is not equal to $n_{i-1}$ ($2 \leq i \leq M$). The multi-level cell has P storage states, wherein $$P = \sum_{i=1}^{M} n_i.$$

In one embodiment, $p=2^q$, and the multi-level cell is a q-bit cell.

In one embodiment, among the $n_i$ Vt levels corresponding to any i, the $1^{st}$ level corresponds to the state of storing no charge, and the $2^{nd}$ level neighboring to the $1^{st}$ level corresponds to a state of storing charges and is raised with an increase in i so that a sufficient read window is present between the $1^{st}$ and the $2^{nd}$ levels and $n_i \leq n_{i-1}$.

In one embodiment, $M=4$, $P=2^4$, and the multi-level cell is a 4-bit cell having 16 storage states corresponding to 16 combinations of the first and the second Vt levels. The 16 combinations may include 6 combinations each including the $1^{st}$ level among the M Vt levels of the first storage site, 5 combinations each including the $2^{nd}$ level among the same, 3 combinations each including $3^{rd}$ level among the same and 2 combinations each including the $4^{th}$ level among the same, or include 6 combinations each including the $1^{st}$ level among the M Vt levels of the first storage site, 4 combinations each including the $2^{nd}$ level among the same, 3 combinations each including the $3^{rd}$ level among the same and 3 combinations each including the $4^{th}$ level among the same.

In one embodiment, $M=3$, $P=2^4$, and the multi-level cell is a 4-bit cell having 16 storage states corresponding to 16 combinations of the first and second Vt levels. The 16 combinations may include 7 combinations each including the $1^{st}$ level among the M Vt levels of the first storage site, 6 combinations each including the $2^{nd}$ level among the same, and 3 combinations each including the $3^{rd}$ level among the same.

The memory apparatus of the invention includes a plurality of the above multi-level cells, and an operation circuit capable of implementing the above operations.

Accordingly, this invention allows adjustment in the position of the $2^{nd}$ level and the number of Vt levels at the second storage site according to the shift of the $1^{st}$ level thereat due to the second bit effect caused by the Vt level of the first storage site, but does not set a large Vt margin for the $1^{st}$ level. Hence, it is possible to provide a sufficient total number of combinations of the Vt levels of the first and the second storage sites, i.e., a sufficient total number of the storage states of the multi-level cell, while maintaining a sufficient read window.

In order to make the aforementioned and other features and advantages of the invention more comprehensible, several embodiments accompanied with figures are described in detail below.

DESCRIPTION OF EMBODIMENTS

Figure 1:
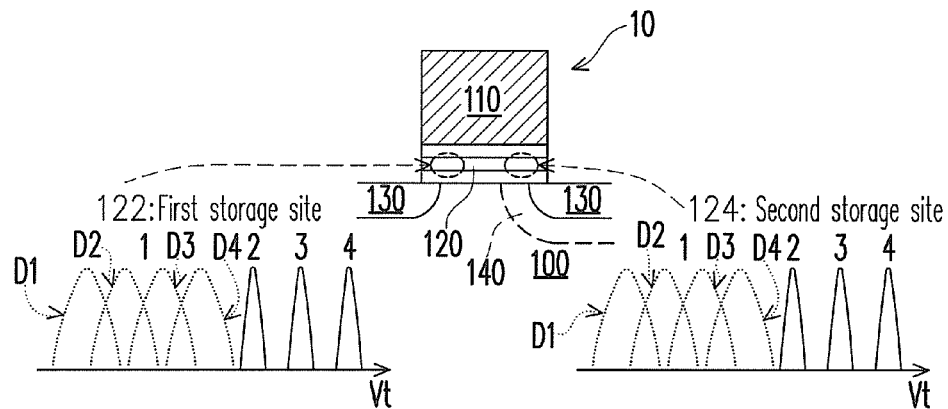
FIG. 1 illustrates a conventional multi-level non-volatile cell having two storage sites and possible distributions of threshold voltages of each storage site.
Figure 2:
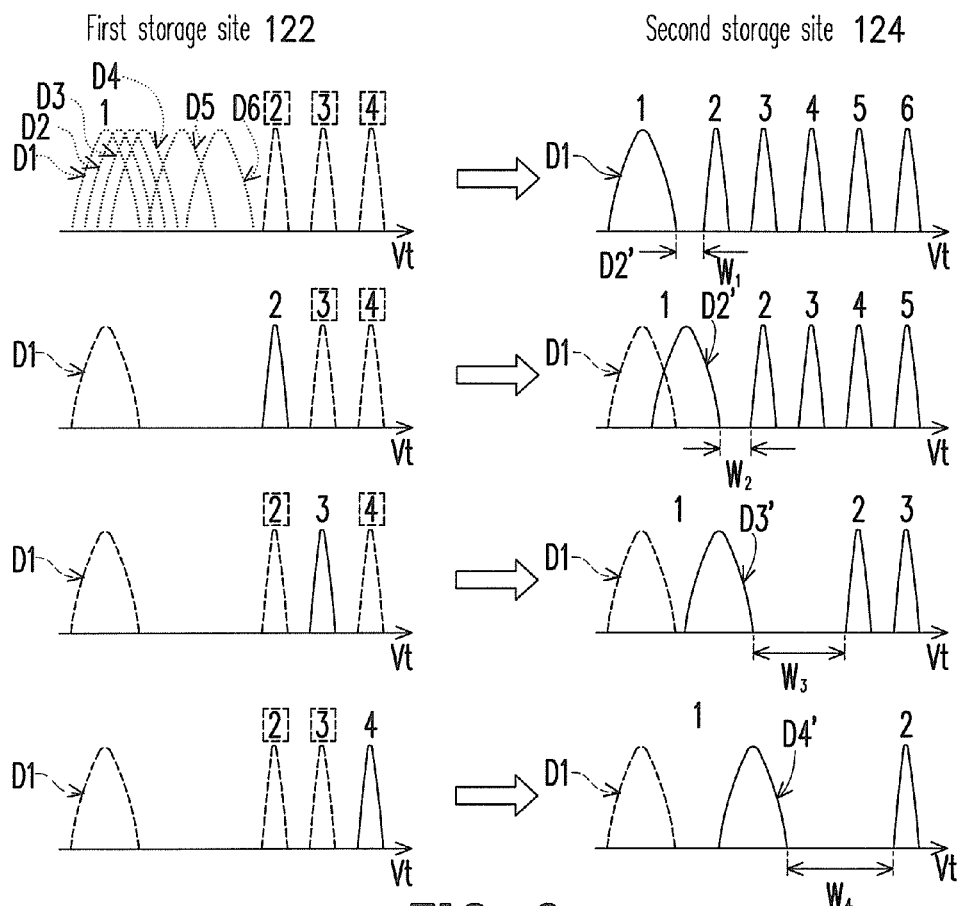
FIG. 2 illustrates an example of 16 Vt level combinations of the two storage sites corresponding to 16 storage states ($P=2^4$) in an embodiment wherein each cell stores 4 bits and the Vt level of the first storage site is one selected from four Vt levels.

FIG. 2 illustrates an example of 16 Vt level combinations of the two storage sites corresponding to 16 storage states ($P=2^4$) in an embodiment wherein each cell stores 4 bits and the Vt level of the first storage site is one selected from four Vt levels.

Referring to FIG. 2, in the programming method of the embodiment, the first storage site 122 has one of the $1^{st}$ to $4^{th}$ Vt levels, wherein the $1^{st}$ level corresponds to the state of storing no electron, the $2^{nd}$ to $4^{th}$ levels in an order from low to high correspond to states of storing electrons, and a higher level corresponds to a state with more electrons stored. Whatever level the first storage site 122 has among the $1^{st}$ to $4^{th}$ Vt levels, the Vt level of the state of storing no electron of the second storage site 124 is designated to the $1^{st}$ level, of which the Vt distribution is shifted right depending on the raise in the Vt level of the first storage site 122. Further, it is possible to program the first storage site 122 first and then the second storage site 124.

When the first storage site 122 has the $1^{st}$ level, i.e., stores no electron, the Vt distribution of the $1^{st}$ level of the second storage site 124 is not shifted right. In the consideration that the read window must be large enough and the level height certainly has an upper limit allowable in the memory operation, at most 6 Vt levels can be set for the second storage site 124. In this example, the 6 Vt levels are all used ($n_1=6$), where the read window between the $1^{st}$ level and the neighboring $2^{nd}$ level is $W_1$. According to the amount of the charges stored, the central values of the distributions D1, D2, D3, D4, D5 and D6 of the $1^{st}$ Vt level of the first storage site 122 when the second storage site 124 is at the $1^{st}$, $2^{nd}$, $3^{rd}$, $4^{th}$, $5^{th}$ and $6^{th}$ levels respectively are in the order of D6>D5>D4>D3>D2>D1, and the central values of the distributions D1, D2', D3' and D4' of the $1^{st}$ Vt level of the second storage site 124 when the first storage site 122 is at the $1^{st}$, $2^{nd}$, $3^{rd}$ and $4^{th}$ levels respectively are in the order of D4'>D3'>D2'>D1.

When the first storage site 122 stores electrons and has the $2^{nd}$ level, the Vt distribution of the $1^{st}$ level of the second storage site 124 is shifted right, so that the $2^{nd}$ level must be shifted right correspondingly to maintain a sufficient read window $W_2$. Hence, in the above consideration, at most 5 Vt levels can be set for the second storage site 124. In this example, the 5 Vt levels are all used ($n_2=5<n_1$).

When the first storage site 122 stores more charges and has the $3^{rd}$ level, the Vt distribution of the $1^{st}$ level of the second storage site 124 is shifted right more, so that the $2^{nd}$ level must be shifted right more to maintain a sufficient read window. Thus, in the above consideration, at most 4 Vt levels can be set for the second storage site 124. However, because a 4-bit cell requires only 16 ($=2^4$) storage states corresponding to 16 combinations of the Vt levels of the first and second storage sites and the total number of the combinations where the first storage site 122 has the $1^{st}$ or $2^{nd}$ level is 11, only 3 Vt levels are used here ($n_3=3<n_2$).

When the first storage site 122 stores even more charges and has the $4^{th}$ level, the Vt distribution of the $1^{st}$ level of the second storage site 124 is further shifted right, so that the $2^{nd}$ level must be further shifted right to maintain a sufficient read window. Therefore, in the above consideration, at most 4 Vt levels can be set for the second storage site 124. However, because a 4-bit cell needs only 16 combinations of the Vt levels of the first and the second storage sites and the total number of the combinations where the first storage site 122 has the $1^{st}$, $2^{nd}$ or $3^{rd}$ level is 14, only 2 Vt levels are used here ($n_4=2<n_3$).

Moreover, for a 4-bit cell that requires only 16 Vt level combinations, the setting of the numbers of the combinations each including the $1^{st}$ level of the first storage site 122, those each including the $2^{nd}$ level of 122, those each including the $3^{rd}$ level of 122 and those each including the $4^{th}$ level of 122 is not limited to the "6+5+3+2" mode ($n_4<n_3<n_2<n_1$) as shown in FIG. 2, but may alternative be any other mode if only the above limitations of $\leq 6$, $\leq 5$, $\leq 4$ and $\leq 4$ are satisfied. For example, the mode of "6+4+3+3" ($n_4=n_3<n_2<n_1$), "6+4+4+2" ($n_4<n_3=n_2<n_1$), "5+5+4+2" ($n_4<n_3<n_2=n_1$) or "5+4+4+3" ($n_4<n_3=n_2<n_1$) is also feasible.

In addition, though the first storage site 122 can have four Vt levels (M=4) in the above embodiment, M may alternatively be 3 if more Vt levels are allowed for the second storage site 124. When each cell stores four bits and M=3, the required 16 Vt level combinations may include 7 combinations each including the $1^{st}$ level among the M Vt levels of the first storage site 122, 6 combinations each including the $2^{nd}$ level among the M Vt levels of the first storage site 122, and 3 combinations each including the $3^{rd}$ level among the M Vt levels of the first storage site 122. This is a "7+6+3" mode ($n_3<n_2<n_1$).

Figure 3:
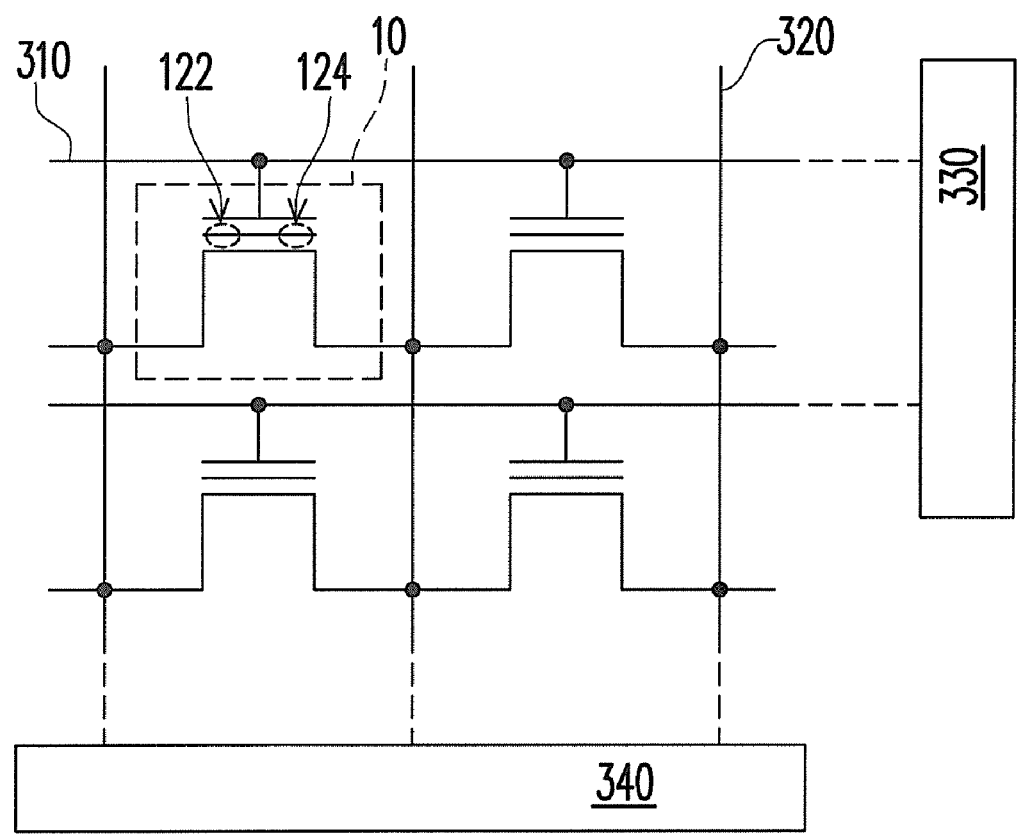
FIG. 3 illustrates a memory apparatus having multi-level non-volatile cells according to an embodiment.

FIG. 3 illustrates a memory apparatus having multi-level cells according to an embodiment. The memory apparatus includes a plurality of multi-level cells 10 arranged in an array and an operation circuit implementing the above multi-level operation. The operation circuit includes a plurality of word lines 310 and a plurality of bit lines 320, wherein each word line 310 is coupled to the gates of a row of cells 10, each bit line 320 is coupled to the S/D regions at one side of a column of cells 10, each word line 310 is coupled to an X-decoder/word-line driver 330, and each bit line 320 is coupled to a Y-decoder/bit-line driver/sensing amplifier 340.

The X- and Y-decoders select a cell to be operated, the word line driver and the bit line driver provide voltages to the selected word line and the selected bit line, and the sensing amplifier is for determining the data value on reading. In programming a selected cell, when the data value to be stored does not correspond to the state at which both storage sites have no electron, the method to cause the first storage site 122 and/or the second storage site 124 to have the corresponding Vt level(s) is, for example, time-controlled channel hot electron injection (CHEI) in association with verification and correction mechanisms such that each threshold voltage is within a narrow range. Such charge injection method capable of precisely controlling the amount of the charges injected is well known technology and is thus not described at length herein.

Accordingly, the above embodiment of this invention adjusts the position of the $2^{nd}$ Vt level and the number of Vt levels at the second storage site according to the shift of the $1^{st}$ Vt level thereat due to the second bit effect caused by the Vt level of the first storage site, but does not set a large Vt margin for the $1^{st}$ Vt level. Hence, it is possible to provide a sufficient total number of combinations of the Vt levels of the first and the second storage sites, i.e., a sufficient total number of the storage states of the multi-level cell, while maintaining a sufficient read window. Thus, dimensional reduction of the multi-level cell is facilitated.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for programming a multi-level cell having a first storage site and a second storage site, comprising:
making the first storage site have a first threshold voltage (Vt) level and the second storage site have a second Vt level, wherein
the first Vt level is selected from M Vt levels,
when the first Vt level is an i-th level among the M Vt levels, the second Vt level is selected from $n_i$ Vt levels, wherein at least one $n_i$ is not equal to $n_{i-1}$ ($2 \leq i \leq M$), and
the multi-level cell has P storage states, wherein $$P = \sum_{i=1}^{M} n_i,$$

$P=2^q$, q is an integer larger than one, and the multi-level cell is a q-bit cell.

2. The method of claim 1, wherein among the $n_i$ Vt levels corresponding to any i, a $1^{st}$ level corresponds to a state of storing no charge, and a $2^{nd}$ level neighboring to the $1^{st}$ level corresponds to a state of storing charges and is raised with an increase in i so that a sufficient read window is present between the $1^{st}$ and the $2^{nd}$ levels and $n_i \leq n_{i-1}$.

3. The method of claim 2, wherein M=4, P=$2^4$, and the multi-level cell is a 4-bit cell having 16 storage states corresponding to 16 combinations of the first and the second Vt levels.

4. The method of claim 3, wherein the 16 combinations of the first and second Vt levels comprise 6 combinations each including the $1^{st}$ level among the M Vt levels of the first storage site, 5 combinations each including the $2^{nd}$ level among the M Vt levels of the first storage site, 3 combinations each including the $3^{rd}$ level among the M Vt levels of the first storage site, and 2 combinations each including the $4^{th}$ level among the M Vt levels of the first storage site.

5. The method of claim 3, wherein the 16 combinations of the first and second Vt levels comprise 6 combinations each including the $1^{st}$ level among the M Vt levels of the first storage site, 4 combinations each including the $2^{nd}$ level among the M Vt levels of the first storage site, 3 combinations each including the $3^{rd}$ level among the M Vt levels of the first storage site, and 3 combinations each including the $4^{th}$ level among the M Vt levels of the first storage site.

6. The method of claim 2, wherein M=3, P=$2^4$, and the multi-level cell is a 4-bit cell having 16 storage states corresponding to 16 combinations of the first and the second Vt levels.

7. The method of claim 6, wherein the 16 combinations of the first and second Vt levels comprise 7 combinations each including the $1^{st}$ level among the M Vt levels of the first storage site, 6 combinations each including the $2^{nd}$ level among the M Vt levels of the first storage site, and 3 combinations each including a $3^{rd}$ level among the M Vt levels of the first storage site.

8. A memory apparatus, comprising:
a plurality of multi-level cells, each comprising a first storage site and a second storage site; and
an operation circuit that makes the first storage site of any selected multi-level cell have a first Vt level and the second storage site of the selected multi-level cell have a second Vt levels, wherein
the first Vt level is selected from M Vt levels,
when the first Vt level is an i-th level among the M Vt levels, the second Vt level is selected from $n_i$ Vt levels, wherein at least one $n_i$ is not equal to $n_{i-1}$ ($2 \leq i \leq M$), and
the multi-level cell has P storage states, wherein $$P = \sum_{i=1}^{M} n_i,$$

$P=2^q$, q is an integer larger than one, and the multi-level cell is a q-bit cell.

9. The memory apparatus of claim 8, wherein among the $n_i$ Vt levels corresponding to any i, a $1^{st}$ level corresponds to a state of storing no charge, and a $2^{nd}$ level neighboring to the $1^{st}$ level corresponds to a state of storing charges and is raised with an increase in i so that a sufficient read window is present between the $1^{st}$ and the $2^{nd}$ levels and $n_i \leq n_{i-1}$.

10. The memory apparatus of claim 9, wherein M=4, P=$2^4$, and the multi-level cell is a 4-bit cell having 16 storage states corresponding to 16 combinations of the first and the second Vt levels.

11. The memory apparatus of claim 10, wherein the 16 combinations of the first and second Vt levels comprise 6 combinations each including the $1^{st}$ level among the M Vt levels of the first storage site, 5 combinations each including the $2^{nd}$ level among the M Vt levels of the first storage site, 3 combinations each including the $3^{rd}$ level among the M Vt levels of the first storage site, and 2 combinations each including the $4^{th}$ level among the M Vt levels of the first storage site.

12. The memory apparatus of claim 10, wherein the 16 combinations of the first and second Vt levels comprise 6 combinations each including the $1^{st}$ level among the M Vt levels of the first storage site, 4 combinations each including the $2^{nd}$ level among the M Vt levels of the first storage site, 3 combinations each including the $3^{rd}$ level among the M Vt levels of the first storage site, and 3 combinations each including the $4^{th}$ level among the M Vt levels of the first storage site.

13. The memory apparatus of claim 9, wherein M=3, P=$2^4$, and the multi-level cell is a 4-bit cell having 16 storage states corresponding to 16 combinations of the first and the second Vt levels.

14. The memory apparatus of claim 13, wherein the 16 combinations of the first and second Vt levels comprise 7 combinations each including the $1^{st}$ level among the M Vt levels of the first storage site, 6 combinations each including the $2^{nd}$ level among the M Vt levels of the first storage site, and 3 combinations each including the $3^{rd}$ level among the M Vt levels of the first storage site.

* * * * *